United States Patent [19]

Kawahata

[11] Patent Number: 4,979,233
[45] Date of Patent: Dec. 18, 1990

[54] HIGH FREQUENCY BROAD-BAND MIXING CIRCUIT INCLUDING AN ELECTROLYTIC CAPACITOR IN PARALLEL WITH A LOCAL OSCILLATOR INPUT PORT

[75] Inventor: Kazunari Kawahata, Kyoto, Japan

[73] Assignee: Murata Manufacturing Co., Ltd., Japan

[21] Appl. No.: 233,210

[22] Filed: Aug. 17, 1988

[30] Foreign Application Priority Data

Aug. 19, 1987 [JP] Japan .................... 62-206053

[51] Int. Cl.$^5$ .............................. H04B 1/26
[52] U.S. Cl. ...................... 455/330; 455/326; 455/317; 455/318
[58] Field of Search ............ 455/326, 330, 318, 319, 455/317; 331/36 C, 22

[56] References Cited

U.S. PATENT DOCUMENTS

| | | | |
|---|---|---|---|
| 2,508,048 | 12/1944 | Sziklai | 455/317 |
| 3,913,037 | 10/1975 | Himono et al. | 455/326 |
| 4,193,048 | 3/1980 | Nyhus | 455/326 |
| 4,449,245 | 5/1984 | Rabe | 455/319 |
| 4,601,063 | 7/1986 | Price | 455/317 |
| 4,677,691 | 6/1987 | Scott | 455/326 |
| 4,677,692 | 6/1987 | Sakashita et al. | 455/319 |

FOREIGN PATENT DOCUMENTS

20040/1983 2/1983 Japan .

OTHER PUBLICATIONS

McGraw-Hill Encyclopedia of Electronics and Computers, 1974, p. 90.

Primary Examiner—Douglas W. Olms
Assistant Examiner—Ralph Smith
Attorney, Agent, or Firm—Ostrolenk, Faber, Gerb & Soffen

[57] ABSTRACT

A broad-band mixing circuit comprises a transmission line transformer connected between a port adapted to receive a radio frequency signal and a double balanced mixing section, the transformer serving to convert an unbalanced radio frequency signal into a balanced signal, a transmission line transformer connected between a local oscillation signal port and the mixing section, the transformer serving to convert an unbalanced local oscillation signal into a balanced signal, and a transmission line transformer connected between the mixing section and an intermediate frequency signal port, the transformer serving to convert the balanced signal from the mixing section into an unblaanced signal. The noise figure is improved by connecting an electrolytic capacitor in parallel with the balanced output end or the input end of the transmission line transformer for the local oscillation signal.

13 Claims, 3 Drawing Sheets

HIGH FREQUENCY BROAD-BAND MIXING CIRCUIT INCLUDING AN ELECTROLYTIC CAPACITOR IN PARALLEL WITH A LOCAL OSCILLATOR INPUT PORT

DESCRIPTION OF THE INVENTION

1. Field of the Invention

This invention relates to a broad-band mixing circuit. More particularly, it relates to a broad-band mixing circuit used for television tuners based on the all-band double superheterodyne system for receiving VHF, UHF band and CATV broadcasts.

2. Description of the Prior Art

50 MHz to 850 MHz frequencies, for example, are used for UHF, VHF and CATV, broadcasts and to receive these broadcasts, it is necessary to use a television tuner which is capable of receiving a wide band of broadcast waves. An example of such television tuner is described in Japanese Patent Laying-Open Gazette No. 20040/1983 which discloses a television tuner of the double superheterodyne system.

FIG. 1 is a schematic block diagram of such a television tuner of the double superheterodyne system. In FIG. 1, a radio frequency broadcast signal is received by an antenna and fed to a radio frequency amplifier 2 where it is amplified, whereupon it is fed to a first mixer 3. The first mixer 3 has a first local oscillation signal $LO_1$ fed thereto from a first local oscillator 4 comprising, for example, a voltage-controlled oscillator (VCO). The first mixer 3 converts the frequency of the radio frequency signal on the basis of the first local oscillation signal $LO_1$ to output a first intermediate frequency signal $IF_1$ whose frequency is higher than that of the received signal.

The first intermediate frequency signal $IF_1$ outputted from the first mixer 3 is extracted by a first intermediate filter 5 and amplified by a first intermediate frequency amplifier 6, whereupon it is fed to a second mixer 8 through a second intermediate filter 7. The second mixer 8 has a second local oscillation signal $LO_2$ fed thereto from a second local oscillator 9. The second mixer 8 converts the frequency on the basis of the second local frequency signal $LO_2$ to output a second intermediate frequency signal $IF_2$ having a lower frequency. This second intermediate frequency $IF_2$ is amplified by a second intermediate frequency amplifier 10 and outputted at an output terminal 11.

FIG. 2 is a view showing the first mixer of FIG. 1 in a symbolic manner.

In FIG. 2, the first mixer 3 is formed, for example, of a mixer of the balanced type such as a double balanced mixer or single balanced mixer. The first mixer 3 includes a radio frequency (RF) port 31, a local oscillation signal (LO) port 32, and an intermediate frequency signal (IF) port 33. In such first mixer 3, in the case of a broad band where the frequency of the radio frequency signal RF is 50–850 MHz and the frequency of the local oscillation signal LO is 1.75–2.55 GHz as in the case where is it used for the above described all-band tuner, favorable terminal end conditions of the local port, for reducing the noise figure (NF), can hardly be realized.

Because a broad band balun is commonly used at the local port for efficient mixing, and since the impedance of such a balun for very low frequencies is not low, low frequency noise noise components such as 1/f noise which the nonlinear device generates are also mixed in addition to mixing concerning the respective frequencies. For this reason, the noise figure of the mixing circuit becomes worse.

Therefore, unnecessary noise components generated by nonlinear device, particularly low frequency components such as 1/f noise, are mixed in the first mixer 3. As a result, the noise figure (NF) of the first mixer 3 sometimes gets extremely worse. The same is also true with the second mixer 8.

SUMMARY OF THE INVENTION

Accordingly, the main object of the invention is to provide a broad-band mixing circuit having its noise figure improved.

This invention is directed to a broad-band mixing circuit including a port through which a radio frequency signal is inputted and a port through which a local oscillation signal is inputted, said broad-band mixing circuit having an electrolytic capacitor connected in parallel with the input line from the local oscillation signal port.

Therefore, according to a first aspect of the invention, the electrolytic capacitor presents a relatively high impedance in the case of a high frequency component such as a local oscillation signal but a low impedance in the case of a low frequency component such as 1/f noise. Thus, the presence of an electrolytic capacitor connected to the input line for the local oscillation signal port ensures that the low frequency noise generated by the nonlinear device is prevented from being mixed.

In a second aspect of the present invention, a first transmission line transformer for converting an unbalanced radio frequency signal into a balanced signal is connected to a radio frequency signal port, a second transmission line transformed for converting an unbalanced local oscillation signal into a balanced signal is connected to a local oscillation signal port, an electrolytic capacitor is connected in parallel with the input line or balanced output side of the second transmission line transformer, and an intermediate frequency signal is outputted by mixing means on the basis of the radio frequency signal and local oscillation signal converted into balanced signals.

Therefore, in said second aspect of the invention also, the low frequency noise components resulting from the unfavorable terminal end conditions of the local oscillation signal port are prevented from being mixed.

In a preferred embodiment, the mixing means is formed of field effect transistors or diodes connected to form a bridge.

A third aspect of the invention is a broad-band mixing circuit including a first port adapted to receive a radio frequency signal and deliver an intermediate frequency signal and a second port adapted to receive a local oscillation signal. A transmission line transformer for converting an unbalanced local oscillation signal into a balanced signal is connected to a local oscillation signal port. Diodes are connected between the balanced output of the transmission line transformer and the first port. An electrolytic capacitor is connected in parallel with the input line of the transmission line transformer or connected to the balanced output.

Therefore, in this third aspect of the invention also, low frequency noise components resulting from the unfavorable terminal end conditions of the local oscillation signal port are prevented from being mixed.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
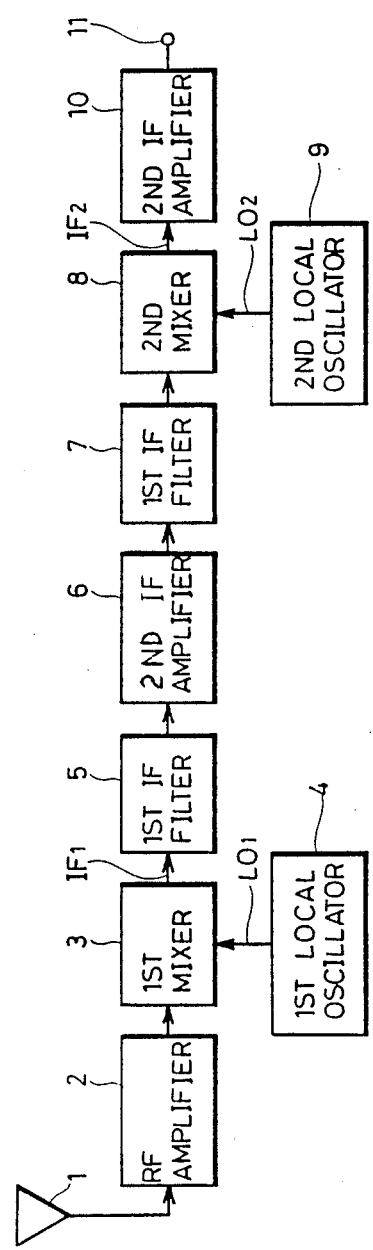
FIG. 1 is a schematic block diagram of a television tuner based on the conventional double superheterodyne system.
Figure 2:
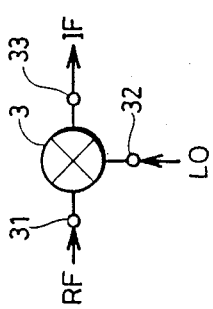
FIG. 2 is a view showing the first mixer of FIG. 1 in a symbolic manner.
Figure 3:
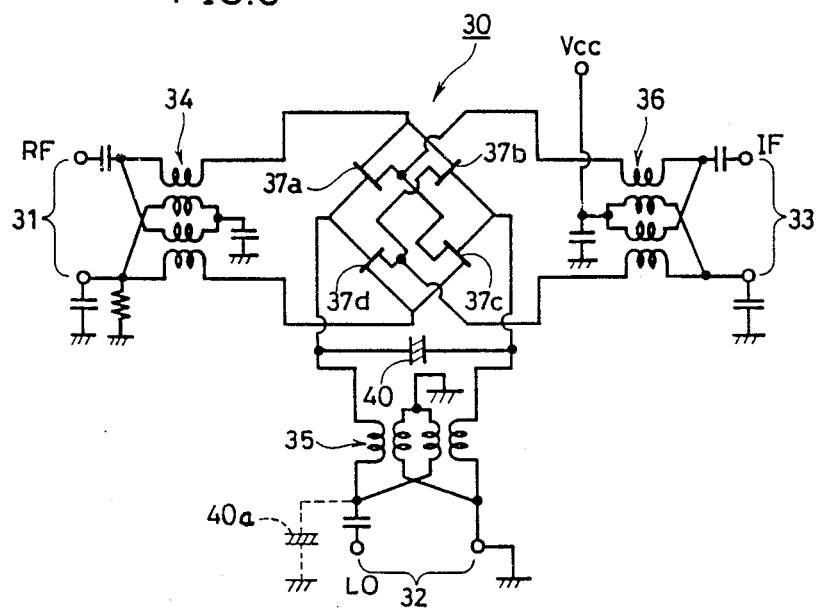
FIG. 3 is an electric circuit diagram showing a first embodiment of the invention.

FIG. 3 is an electric circuit diagram showing first embodiment of the invention.

A mixing circuit as shown in FIG. 3 is an example of an active balanced mixer. The circuit includes a mixing section 30 comprising 4 FETs 37a–37d connected to form a bridge. Connected between this mixing section 30 and a radio frequency signal port 31 is a transmission line transformer 34 for converting an unbalanced radio frequency signal RF into a balanced signal to be fed to the mixing section 30. Similarly, connected between a local frequency signal port 32 and the mixing section 30 is a transmission line transformer 35 for converting an unbalanced local frequency signal LO into a balanced signal to be fed to the mixing section 30. Further, connected between the mixing section 30 and an intermediate frequency signal port 33 is a transmission line transformer 36 for converting a balanced signal outputted from the mixing section 30 into an intermediate frequency signal IF. Such arrangement has been known.

Further, in this embodiment, a non-polar electrolytic capacitor 40 is connected in parallel on the output side of the transmission line transformer 35 and in the input line from the local oscillation signal port 32 to the mixing section 30, that is, subsequent to the unbalanced-balanced conversion of local oscillation signals.

Figure 4:
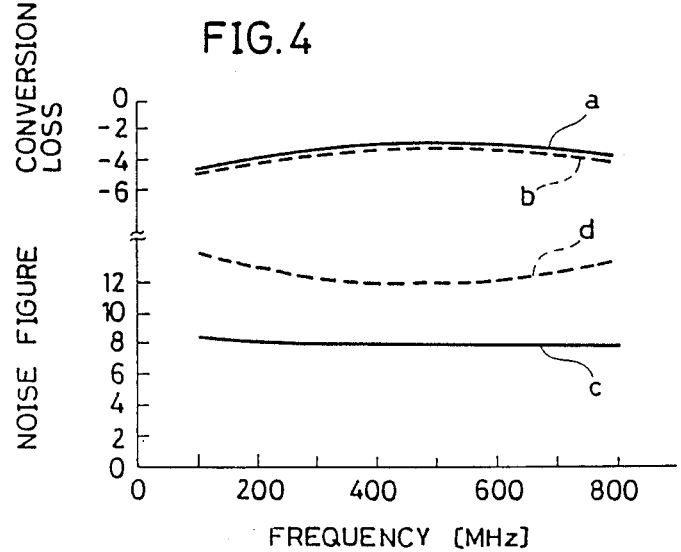
FIG. 4 is a graph showing conversion loss and noise figure characteristics of mixing circuits according to a first embodiment of the invention and a conventional example.
Figure 5:
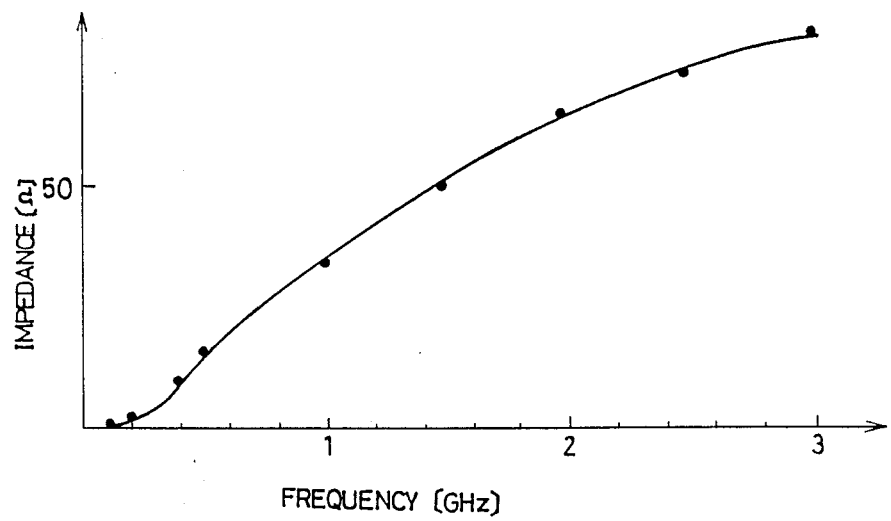
FIG. 5 is a graph showing an impedance characteristic of an electrolytic capacitor.

FIG. 4 is a view showing conversion loss characteristics and noise figure characteristics of the first embodiment of the invention and a conventional mixing circuit, and FIG. 5 is a view showing the impedance characteristic of an electrolytic capacitor.

It is assumed that in the mixing circuit shown in FIG. 3, the frequency of the radio frequency signal RF is 50–850 MHz, the frequency of the local oscillation signal LO is 1.75–2.55 GHz, and the frequency of the intermediate frequency signal IF is 1.7 GHz. Under such a condition, the electrolytic capacitor 40 was connected to the output side of the transmission line transformer 35 and measurements of the conversion loss and the noise figure of the mixing circuit were made. The results thereof are as shown in FIG. 4. As is clear from FIG. 4, there is almost no difference between the conversion loss a in the embodiment of the invention and the conversion loss b in the prior art, but so far as the noise figure is concerned, it is improved as shown at c to a great degree as compared with a prior art example d, it being seen that in a better region the noise figure is improved by as much as 5 dB or thereabouts.

This is because the impedance of the electrolytic capacitor 40 is high in the case of high frequency components such as the local oscillation signal LO as mentioned above, but it is low in the case of low frequency components such as 1/f noise. Therefore, the input line from the local oscillation signal port 32 is substantially shorted by the electrolytic capacitor 40 in the case of a low frequency noise component, whereby the noise components are prevented from entering the mixer 30 and being mixed therein.

The impedance characteristic of the electrolytic capacitor 40 increases with increasing frequency as shown in FIG. 5. Further, when the frequency is low, the impedance of the electrolytic capacitor is about several Ω.

When the electrolytic capacitor 40 is connected to the output side of the transmission line transformer 35 as shown in FIG. 3, the risk of effects including an external hum is great. Alternatively, it may be connected to the input side of the transmission line transformer 35, as indicated in phantom at 40a in FIG. 3, also and this can also be expected to provide more or less improvement in noise figure.

It is when the level of the local oscillation signal LO is high that a non-polar electrolytic capacitor is desirable for use as the electrolytic capacitor 40. In a mixing circuit where saturation takes place when the level of the local oscillation signal is low, the same effects can be attained even if a polar electrolytic capacitor is used.

Figure 6:
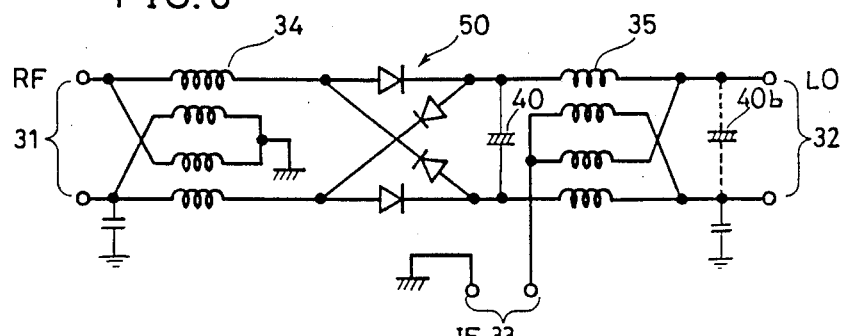
FIG. 6 is an electric circuit diagram showing a second embodiment of the invention.

FIG. 6 shows an electric circuit diagram according to a second embodiment of the invention. The embodiment shown in FIG. 6 comprises a diode double balanced mixer 50 with diodes connected to form a bridge. Connected in the same manner between the mixing section 50 and the radio frequency signal port 31 is a transmission line transformer 34, and a transmission line transformer 35 is connected between the local oscillation signal port 32 and the mixing section 50. The transmission line transformer 35 has an intermediate frequency signal port 33 connected thereto.

In this embodiment, as in the previous embodiment an electrolytic capacitor 40 is connected to the output side of the transmission line transformer 35 for the local oscillation signal. When the electrolytic capacitor 40 is connected to the output side of the transmission line transformer 35 for the local oscillation signal in this manner, since the impedance is relatively high in the case of high frequency components such as the local oscillation signal and since, conversely, the impedance is relatively low in the case of low frequency components such as 1/f noise, low frequency noise components resulting from unfavorable terminal end conditions of the local oscillation signal port 32 can be prevented from being mixed.

In addition, the electrolytic capacitor may be connected to the balanced input side of the transmission line transformer 35 as shown in phantom at 40b.

Figure 7:
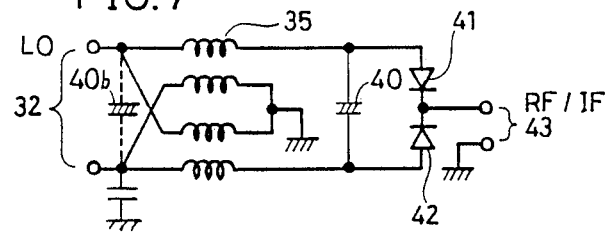
FIG. 7 is an electric circuit diagram showing a third embodiment of the invention.

FIG. 7 is an electric circuit diagram according to a third embodiment of the invention. In the embodiment shown in FIG. 7, the invention is applied to a single balanced mixer. Thus, the transmission line transformer 35 is connected to the local transmission signal port 32, and diodes 41 and 42 are connected between the balanced output side of the transmission line transformer 35 and the radio frequency signal and intermediate frequency signal port 43. In this embodiment also, an electrolytic capacitor 40 is connected to the output side of the transmission line transformer 35. In addition, this electrolytic capacitor may be connected to the balanced input side of the transmission line transformer 35 as shown in phantom at 40b. Even if the electrolytic capacitor 40 is connected to the single balanced mixer, the noise figure can be improved to a great degree in the same manner as in the preceding embodiment.

As has so far been described, according to this invention, the noise figure can be improved to a great degree by simply adding a single electrolytic capacitor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A broad-band mixing circuit including a first port adapted to receive a radio frequency signal and a second port adapted to receive a local oscillation signal not lower than 100 MHz, wherein an intermediate signal is outputted at a third port as a function of said radio frequency signal and said local oscillation signal, said broad-band mixing circuit comprising:
   a first transmission line transformer connected to said first port adapted to receive said radio frequency signal for converting an unbalanced radio frequency signal from said first port into a balanced signal,
   a second transmission line transformer connected to said second port adapted to receive said local oscillation signal for converting an unbalanced local oscillation signal from said second port into a balanced signal,
   mixing means for outputting an intermediate frequency signal as a function of said balanced radio frequency signal and balanced local oscillation signal, and
   an electrolytic capacitor of at least 1 µF across the balanced output side of said second transmission line transformer.

2. A broad-band mixing circuit as set forth in claim 1, wherein:
   said mixing means includes field effect transistors connected to form a bridge.

3. A broad-band mixing circuit as set forth in claim 1, wherein:
   said mixing means includes diodes connected to form a bridge.

4. A broad-band mixing circuit as in claim 1, wherein said capacitor is a non-polarized electrolytic capacitor.

5. A broad-band mixing circuit including a first port adapted to receive a radio frequency signal and a second port adapted to receive a local oscillation signal not lower than 100 MHz, wherein an intermediate signal is outputted at a third port as a function of said radio frequency signal and said local oscillation signal, said broad-band mixing circuit comprising:
   a first transmission line transformer connected to said first port adapted to receive said radio frequency signal for converting an unbalanced radio frequency signal from said first port into a balanced signal,
   a second transmission line transformer connected to said second port adapted to receive said local oscillation signal for converting an unbalanced local oscillation signal from said second port into a balanced signal,
   mixing means for outputting an intermediate frequency signal as a function of said balanced radio frequency signal and balanced local oscillation signal, and
   an electrolytic capacitor of at least 1 µF connected across the input side of said second transmission line transformer.

6. A broad-band mixing circuit as set forth in claim 5, wherein:
   said mixing means includes field effect transistors connected to form a bridge.

7. A broad-band mixing circuit as set forth in claim 5, wherein:
   said mixing means includes diodes connected to form a bridge.

8. A broad-band mixing circuit as in claim 5, wherein said capacitor is a non-polarized electrolytic capacitor.

9. A broad-band mixing circuit including a first port adapted to receive a radio frequency signal and deliver an intermediate frequency signal and a second port adapted to receive a local oscillation signal, said broad-band mixing circuit comprising:
   a transmission line transformer connected to said second port adapted to receive said local oscillation signal for converting an unbalanced local oscillation signal from said second port into a balanced signal,
   diodes connected to interconnect between the balanced output of said transmission line transformer and said first port, and
   an electrolytic capacitor connected across the input side of said transmission line transformer.

10. A broad-band mixing circuit as in claim 9, wherein said capacitor is a non-polarized electrolytic capacitor.

11. A broad-band mixing circuit including a first port adapted to receive a radio frequency signal and deliver an intermediate frequency signal and a second port adapted to receive a local oscillation signal, said broad-band mixing circuit comprising:
   a transmission line transformer connected to said second port adapted to receive said local oscillation signal for converting an unbalanced local oscillation signal from said second port into a balanced signal,
   diodes connected to interconnect between the balanced output of said transmission line transformer and said first port, and
   an electrolytic capacitor connected across the balanced output side of said transmission line transformer.

12. A broad-band mixing circuit as in claim 11, wherein said capacitor is a non-polarized electrolytic capacitor.

13. A broad-band mixing circuit including a first port adapted to receive a radio frequency signal and a second port adapted to receive a local oscillation signal not lower than 100 MHz, wherein an intermediate signal is outputted at a third port as a function of said radio frequency signal and said local oscillation signal, said broad-band mixing circuit comprising:
   a first transmission line transformer connected to said first port adapted to receive said radio frequency signal for converting an unbalanced radio frequency signal from said first port into a balanced signal, and a second transmission line transformer connected to said second port adapted to receive said local oscillation signal for converting an unbalanced local oscillation signal from said second port into a balanced signal, and mixing means for outputting an intermediate frequency signal as a function of said balanced radio frequency signal and balanced local oscillation signal, wherein said second port comprises a pair of input terminals, and an electrolytic capacitor of at least 1 $\mu$F is connected between one of said input terminals and ground.

* * * * *